United States Patent
Miyake (10) Patent No.: US 12,041,753 B2
(45) Date of Patent: Jul. 16, 2024

(54) ELECTRONIC DEVICE

(71) Applicant: DENSO CORPORATION, Kariya (JP)

(72) Inventor: Toshihiro Miyake, Kariya (JP)

(73) Assignee: DENSO CORPORATION, Kariya (JP)

( * ) Notice: Subject to any disclaimer, the term of this patent is extended or adjusted under 35 U.S.C. 154(b) by 261 days.

(21) Appl. No.: 17/542,589

(22) Filed: Dec. 6, 2021

(65) Prior Publication Data

US 2022/0210942 A1 Jun. 30, 2022

(30) Foreign Application Priority Data

Dec. 25, 2020 (JP) ................. 2020-216400

(51) Int. Cl.
*H05K 7/20* (2006.01)
*H01L 23/36* (2006.01)

(52) U.S. Cl.
CPC ........... *H05K 7/2039* (2013.01); *H01L 23/36* (2013.01)

(58) Field of Classification Search
None
See application file for complete search history.

(56) References Cited

U.S. PATENT DOCUMENTS

| | | | | |
|---|---|---|---|---|
| 6,229,216 B1 * | 5/2001 | Ma | ..................... | H01L 23/49827 257/722 |
| 6,580,611 B1 * | 6/2003 | Vandentop | ............ | H01L 23/367 257/713 |
| 8,482,120 B2 * | 7/2013 | Jafari | ..................... | H05K 1/141 257/713 |
| 9,190,399 B2 * | 11/2015 | Lamorey | ................. | H01L 25/50 |
| 10,504,813 B2 * | 12/2019 | Davare | ................ | H05K 1/0206 |
| 10,681,801 B2 * | 6/2020 | Kotlar | .................. | H05K 1/0204 |
| 11,596,067 B2 * | 2/2023 | Chou | ....................... | H05K 1/144 |
| 2004/0183193 A1 * | 9/2004 | Koide | ..................... | H01L 23/50 257/E23.079 |
| 2006/0274512 A1 * | 12/2006 | Brandenburg | ...... | H01L 23/3677 257/E23.101 |
| 2010/0000766 A1 * | 1/2010 | Loiselet | ............... | H05K 1/0203 29/830 |
| 2012/0075807 A1 * | 3/2012 | Refai-Ahmed | ... | H01L 23/49827 257/E23.101 |
| 2017/0290212 A1 * | 10/2017 | Palaniswamy | .......... | H01L 33/62 |
| 2021/0013121 A1 | 1/2021 | Miyake | | |

FOREIGN PATENT DOCUMENTS

| | | |
|---|---|---|
| JP | 2006-308620 A | 11/2006 |
| JP | 2008-235321 A | 10/2008 |
| JP | 2013-123011 A | 6/2013 |

* cited by examiner

Primary Examiner — Courtney L Smith
(74) Attorney, Agent, or Firm — Posz Law Group, PLC (57) ABSTRACT

An electronic device includes a heat generator including at least an electronic component generating heat, a case dissipating heat from the heat generator, a heat conductive member conducting heat of the heat generator to a heat dissipation member, and a metal bonding layer interposing between the heat generator and the heat conductive member and including at least a first bonding layer using gold or gold alloy as a constituting material. Thickness of the metal bonding layer is smaller than flatness of a bonding region which is bonded to a metal bonding layer on a facing surface of the heat generator and a facing surface of the heat conductive member. The heat conductive member has flexibility, is joined to the heat generator via the metal bonding layer, and is in contact with the case.

20 Claims, 6 Drawing Sheets

ELECTRONIC DEVICE

CROSS REFERENCE TO RELATED APPLICATION

The present application is based on and claims the benefit of priority of Japanese Patent Application No. 2020-216400, filed on Dec. 25, 2020, the disclosure of which is incorporated herein by reference.

TECHNICAL FIELD

The disclosure generally relates to an electronic device.

BACKGROUND INFORMATION

A comparative electronic device includes a heat generator. The heat generator includes an electronic component and a heat dissipation member. The heat generator is conducted to a housing via a heat conductive member such as a heat dissipation gel, and is dissipated/radiated from the housing. The heat conductive member is interposed between the heat generator and the housing, and is in contact with each of the heat generator and the housing. Therefore, thermal resistance of a heat dissipation path is large. Further improvements are required for electronic devices in the above-mentioned viewpoints or in other viewpoints not mentioned.

SUMMARY

It is an object of the present disclosure to provide an electronic device with improved heat dissipation capability.

The disclosed plural aspects in the specification of the present disclosure adopt different technical solutions from each other in order to achieve their respective objectives.

BRIEF DESCRIPTION OF THE DRAWINGS

Objects, features, and advantages of the present disclosure will become more apparent from the following detailed description made with reference to the accompanying drawings, in which.

EMBODIMENTS FOR CARRYING OUT INVENTION

Hereinafter, a plurality of embodiments will be described with reference to the drawings. In a plurality of embodiments, functionally and/or structurally corresponding parts and/or related parts may be given the same reference numeral or the same reference numeral for digits of tens and ones. For corresponding parts and/or associated parts, additional explanations can be made to the description of other embodiments. When only a part of the configuration is described in an embodiment, the configuration of the other, preceding embodiment(s) are applicable to the rest of such configuration. Further, not only a combination of the configurations explicitly shown in the description of the respective embodiments, but also a combination of the configurations not explicitly shown may also be possible unless such a combination is being hindered by difficulty in particular.

First Embodiment

First, a schematic configuration of an electronic device is described with reference to FIG. 1. In the following, the stacking direction of the heat generator, the heat conductive member, and the housing is referred to as the Z direction. Further, one direction orthogonal to the Z direction is indicated as the X direction. Further, a planar shape is a shape viewed in a plan view from the Z direction unless otherwise specified. The Z direction is arbitrarily defined as vertical, with the positive Z direction defined as upwards. A plane orthogonal to the Z direction is defined as horizontal.

<Electronic Device>

Figure 1:
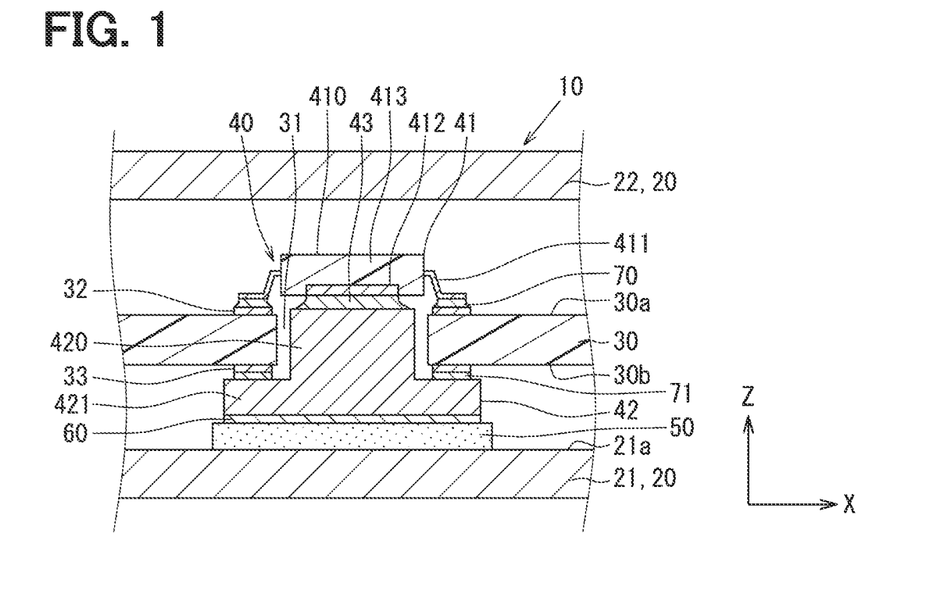
FIG. 1 is a cross-sectional view of an electronic device according to a first embodiment.

An electronic device 10 shown in FIG. 1 includes a housing 20, a substrate 30, a heat generator 40, a heat conductive member 50, and a metal bonding layer 60.

The housing 20 houses at least a part of other elements constituting the electronic device 10 and protects the housed elements. In the present embodiment, the housing 20 houses the substrate 30, the heat generator 40, the heat conductive member 50, and the metal bonding layer 60. The housing 20 is divided into two members in the Z direction. The housing 20 has a case 21 and a cover 22. The housing 20 is provided by assembling the case 21 and the cover 22 to each other. The case 21 and the cover 22 respectively have, for example, a box shape in which the surfaces facing each other are open.

The case 21 is made of a metal material such as aluminum in order to function as a heat dissipation member that dissipates heat received from the heat generator 40. Like the case 21, the cover 22 may be made of a metal material or may be made of a resin material. In the present embodiment, the cover 22 is also formed by using a metal material.

The substrate 30 is formed by arranging wiring on a base material made of an electrically insulating material such as resin. The substrate 30 may be referred to as a printed circuit board or a wiring board. The wiring described above forms a circuit together with a plurality of electronic components mounted on the substrate 30. The substrate 30 is fixed to the case 21 or to the cover 22 constituting the housing 20. In the fixed state, a substrate thickness direction of the substrate 30 substantially coincides with the Z direction. The substrate 30 has an upper surface 30a and a lower surface 30b. The upper surface 30a faces the cover 22, and the lower surface 30b faces the case 21. The electronic component is mounted on at least one of the upper surface 30a and the lower surface 30b.

The substrate 30 has a through hole 31. The through hole 31 extends in a substrate thickness direction of the substrate 30 and opens on the upper surface 30a and the lower surface 30b. The through hole 31 is sometimes referred to as a through hole. The through hole 31 has, for example, a substantially cylindrical shape. As an example, the substrate 30 may have a land 32 that functions as wiring and a land 33 that does not function. The land 33 is sometimes referred to as a dummy land. Further, the land 33 may have a function as a ground wiring. The land 32 is arranged at the proximity, or around, an opening of the through hole 31 on the upper surface 30a of the substrate 30. The land 33 is arranged at the proximity, or around, an opening of the through hole 31 on the lower surface 30b of the substrate 30. The substrate 30 may have a non-penetrating hole that opens only on one of the upper surface 30a and the lower surface 30b instead of having the through hole 31. In such case, the heat generator 40 does not protrude toward the lower surface 30b through the hole.

The heat generator 40 includes at least a heat generating component 41 which is an electronic component that generates heat when energized. FIG. 1 shows only the heat generating component 41 among the plurality of electronic components constituting a circuit. The heat generating component 41 is a component having a large heat generating amount among a plurality of electronic components mounted on the substrate 30. In the present embodiment, the heat generating component 41 is provided as a semiconductor package. The heat generating component 41 is a surface mount type component. The heat generating component 41 is mounted on the upper surface 30a of the substrate 30. The heat generating component 41 has a main body 410 and terminals 411.

The main body 410 is sealed by a sealing resin body 413 with a semiconductor chip (not shown) mounted on a heat sink 412. The sealing resin body 413 may be referred to as a mold resin, for example. The semiconductor chip may be an element having a large heat generating amount, e.g., a power-handling switching element such as MOSET provided by itself. The semiconductor chip may be an IC chip in which semiconductor elements are integrated as a chip. For example, a processor may be implemented on one chip.

The heat sink 412 is exposed from the sealing resin body 413 on a bottom surface of the main body 410. The heat sink 412 is arranged at a position overlapping the through hole 31 of the substrate 30 in a plan view from the Z direction. The terminal 411 extends inside and outside the main body 410 (i.e., the sealing resin body 413). The terminal 411 is electrically connected to the semiconductor chip inside the sealing resin body 413. The terminal 411 is connected to the corresponding land 32 via a bonding material 70 such as solder or silver paste.

The heat generator 40 of the present embodiment further includes a metal block 42. The metal block 42 is formed by using a metal material having good or high thermal conductivity. The metal block 42 is connected to a heat generating component 41, specifically, to a heat sink 412, via a bonding material 43 such as solder or silver paste. A part of the metal block 42 is arranged in the through hole 31. The metal block 42 projects from the lower surface 30b of the substrate 30 through the through hole 31. Specifically, in the Z direction, one end of the metal block 42 is connected to the heat sink 412, and the other end is connected to the heat conductive member 50.

The shape of the metal block 42 is not particularly limited. For example, a substantially cylindrical shape having a constant diameter may be adopted. The planar shape is not limited to a circular shape. For example, it may be a polygonal shape. In the present embodiment, the metal block 42 has a diameter-reduced portion 420 and a diameter-expanded portion 421. Both the diameter-reduced portion 420 and the diameter-expanded portion 421 have a substantially cylindrical shape. The diameter is almost constant in each of the diameter-reduced portion 420 and the diameter-expanded portion 421. At least a part of the diameter-reduced portion 420 is arranged in the through hole 31. The diameter-expanded portion 421 is connected to the diameter-reduced portion 420 and is arranged in a space below a lower surface 30b side of the substrate 30. The diameter of the diameter-expanded portion 421 is larger than the diameter of the diameter-reduced portion 420. As a result, an upper surface of the diameter-expanded portion 421 faces a proximity of the opening of the lower surface 30b. The surface of the diameter-expanded portion 421 facing the lower surface 30b is connected to the (dummy) land 33 via a bonding material 71 such as solder or silver paste. Thus, the diameter-expanded portion 421 supports the substrate 30 (through the bonding material 71 and the dummy land 33)

The heat conductive member 50 is interposed between the heat generator 40 and the case 21. Specifically, it is interposed between an end portion of the metal block 42 and an inner surface 21a of a bottom portion of the case 21 in the Z direction. The heat conductive member 50 is joined to the metal block 42 and is in contact with the case 21.

The metal bonding layer 60 is interposed between the heat generator 40 and the heat conductive member 50, and joins the heat generator 40 (i.e., the metal block 42) and the heat conductive member 50. The metal bonding layer 60 forms a bonded structure 80 together with the heat generator 40 and the heat conductive member 50. Details of the bonded structure 80 including the metal bonding layer 60 will be described later.

<Bonded Structure>

Figure 2:
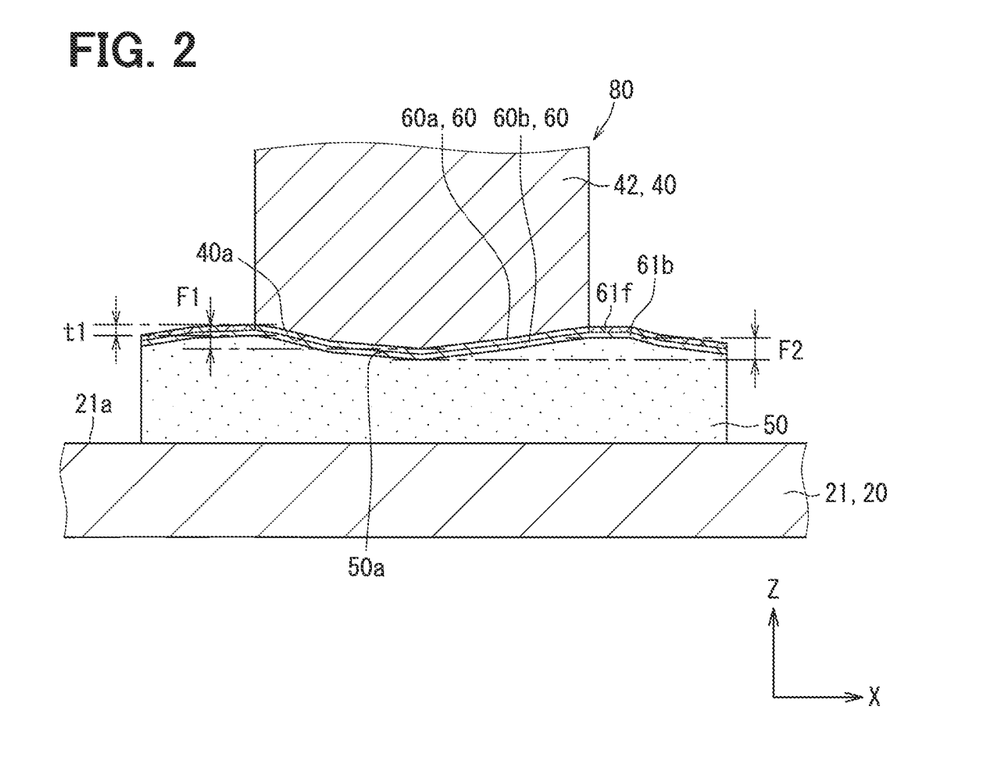
FIG. 2 is a cross-sectional view of a proximity of a bonded structure in the electronic device.

Next, the bonded structure 80 included in the electronic device 10 will be described with reference to FIG. 2. FIG. 2 is an enlarged view of the proximity of the bonded structure 80 in the electronic device 10 shown in FIG. 1. In FIG. 2, the case 21 which is a heat dissipation member is also illustrated together with the bonded structure 80.

The metal block 42 constituting part of the heat generator 40 is a metal member that is formed by using a metal having good/high thermal conductivity as its constituting material, that is, using a metal such as copper, a copper alloy, aluminum, or an aluminum alloy. The heat generator 40 including the metal block 42 has a facing surface 40a facing the heat conductive member 50. In the present embodiment, an end surface of the metal block 42 forms the facing surface 40a. The facing surface 40a corresponds to the first surface.

Since the heat conductive member 50 is sandwiched between the case 21 and the heat generator 40 in a fixed state, it has flexibility to follow unevenness and absorb height variations. However, the heat conductive member 50 does not have fluidity like thermal gel, thermal grease, and adhesive. Further, the heat conductive member 50 has good/high heat conductivity to conduct heat of the heat generator 40 to the case 21 which is a heat dissipation member. Further, the heat conductive member 50 is configured so that it can be joined to the heat generator 40 at room temperature.

Specifically, the heat conductive member 50 is made of any one of a graphite sheet, a carbon nanotube sheet, a graphite mixed resin, and a filler mixed resin. The graphite resin is a mixture of graphite and resin, for example, processed into a sheet and provided as a heat conductive member 50. The filler mixed resin is a resin such as an epoxy resin or polyimide to which an inorganic filler and/or a metal filler is added in order to enhance thermal conductivity. For example, it is processed into a sheet and provided as a heat conductive member 50. Examples of the inorganic filler include alumina, silica, silicon nitride, and boron nitride. Further, examples of the metal filler include copper, aluminum, nickel, silver and the like. Further, as the metal filler which is an inorganic filler, a sintered body of filler particles may be used instead of the filler alone.

The heat conductive member 50 has a facing surface 50a facing upwards towards the heat generator 40. In the heat conductive member 50, a surface thereof, which is an opposite surface opposite to a contact surface contacting an inner surface 21a of the case 21, forms the facing surface 50a. The facing surface 50a corresponds to a second surface. The facing surfaces 40a and 50a corresponding to the first surface and the second surface, and are also known as joining surfaces.

The arrangement of the metal block 42 and the heat conductive member 50, that is, a size relationship of the two is not particularly limited in a plan view seen from a facing direction of the metal block 42 and the heat conductive member 50, that is, the Z direction. The metal block 42 (i.e., the heat generator 40) and the heat conductive member 50 may respectively have at least a region that overlaps with each other in a plan view. In the present embodiment, the facing surface 50a of the heat conductive member 50 includes/encompasses an entire area of the facing surface 40a in a plan view. The entire area of the facing surface 40a of the heat generator 40 faces a portion of the facing surface 50a of the heat conductive member 50. A part of the facing surface 50a of the heat conductive member 50 faces the facing surface 40a of the heat generator 40, and a remaining part of the facing surface 50a is a region not facing the heat generator 40. Although not shown, the facing surface 40a of the heat generator 40 may be arranged to include/encompass the entire area of the facing surface 50a of the heat conductive member 50 in a plan view, or the facing surfaces 40a and 50a may be arranged to substantially coincide with each other in a plan view.

The metal bonding layer 60, interposing in between the facing surface 40a of the heat generator 40 and the facing surface 50a of the heat conductive member 50, joins the heat generator 40 (i.e., the metal block 42) and the heat conductive member 50. The metal bonding layer 60 is interposed in at least a part of a facing region between the heat generator 40 and the heat conductive member 50. In the present embodiment, the metal bonding layer 60 is interposed in almost the entire facing region of the heat generator 40 and the heat conductive member 50.

The metal bonding layer 60 includes at least a first bonding layer. The first bonding layer is made of gold or a gold alloy as a constituting material. The first bonding layer may be referred to as a gold bonding layer or a gold-containing bonding layer. The first bonding layer joins the heat generator 40 and the heat conductive member 50 with, i.e., by using, the metal bonding layer 60. The metal bonding layer 60 of the present embodiment includes first bonding layers 60a and 60b, also known as the first lower bonding layer 60a and the first upper bonding layer 60b.

As described later, the first bonding layer 60a is mainly a bonding layer derived from or implemented as a first metal film 61a formed on the facing surface 40a of the heat generator 40. The first bonding layer 60b is mainly a bonding layer derived from or implemented as a first metal film 61b formed on the facing surface 50a of the heat conductive member 50. Each of the first metal films 61a and 61b is a gold-containing film made of gold or a gold alloy as a constituting material. The gold in the first metal film 61a and the gold in the first metal film 61b are mutually diffused (i.e., atomic diffusion bonding) to form or provide the first bonding layers 60a and 60b. Therefore, the first bonding layers 60a and 60b form one gold-containing bonding layer. As shown in FIG. 2, the bonded structure 80 has the first metal film 61b on a non-facing region of the facing surface 50a of the heat conductive member 50. The first metal film 61b surrounds (extends horizontally beyond) the first bonding layer 60b and, in higher "hierarchy," the metal bonding layer 60 in a plan view. The first metal film 61b in the non-facing region is a portion of the first metal films 61a and 61b that does not contribute to diffusion bonding and remains as a film.

As will be described later, each of the first metal films 61a and 61b is made by a sputtering method. As a result, the thickness of each of the first bonding layers 60a and 60b is on the order of nm (nanometers), for example, a dozen nm. A thickness t1 of the metal bonding layer 60 is less than a flatness F1 of the facing surface 40a of the heat generator 40 and a flatness F2 of the facing surface 50a of the heat conductive member 50 in the bonding region. The thickness t1 is on the order of nm, for example, several tens of nm. The flatnesses F1 and F2 are on the order of μm, for example, 1 to 3 μm. The bonding region is a region in which the metal bonding layer 60 is formed in the facing region.

In the metal bonding layer 60 described above, at least the first bonding layers 60a and 60b contain a fluorine element. The fluorine element is dispersed inside the first bonding layers 60a and 60b, that is, inside the gold-containing bonding layer. In the present embodiment, the fluorine element is dispersed throughout the metal bonding layer 60.

The bonded structure 80 of the present embodiment further includes a fluorine-containing film 61f. The fluorine-containing film 61f may be a film containing a fluorine element (i.e., a fluorine atom). As will be described later, the fluorine dispersed inside the first bonding layers 60a and 60b is derived from the fluorine-containing film 61f formed on the first metal films 61a and/or 61b. The fluorine-containing film 61f in the non-facing region included in the bonded structure 80 is a portion that remains as a film without diffusing into the metal bonding layer 60. The fluorine-containing film 61f surrounds the metal bonding layer 60 in a plan view (after joining).

<Manufacturing Method of Bonded Structure>

Figure 3:
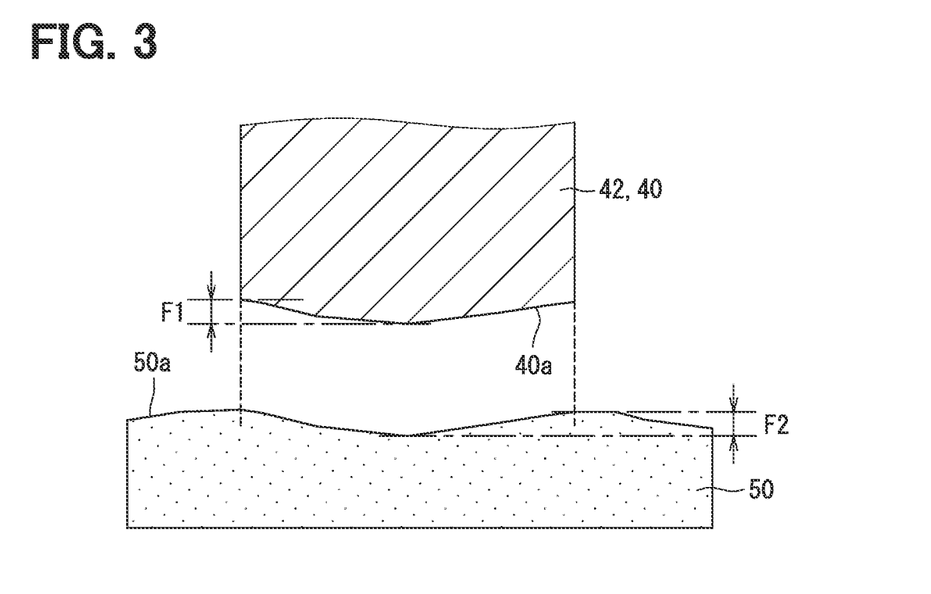
FIG. 3 is a cross-sectional view of a method of manufacturing the bonded structure.
Figure 4:
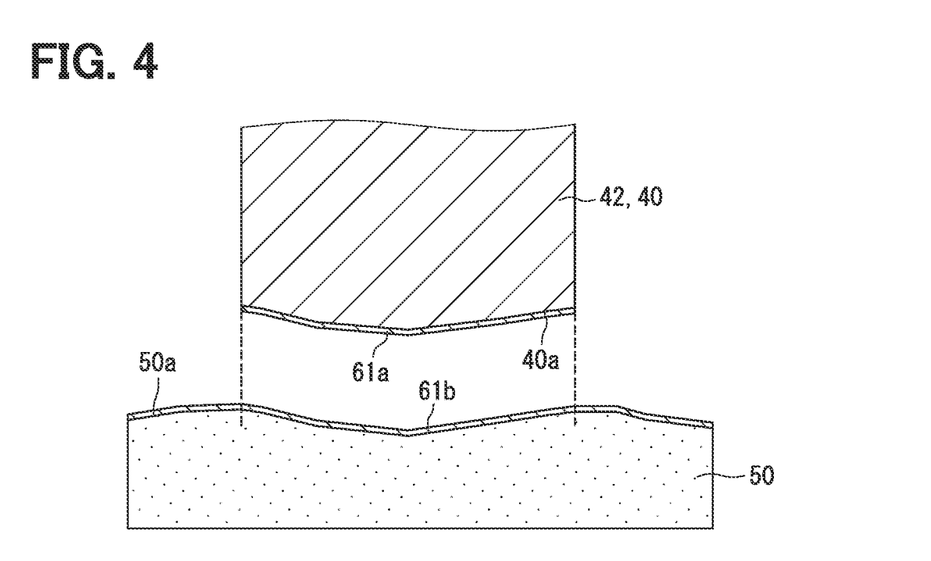
FIG. 4 is a cross-sectional view of a method of manufacturing the bonded structure.
Figure 5:
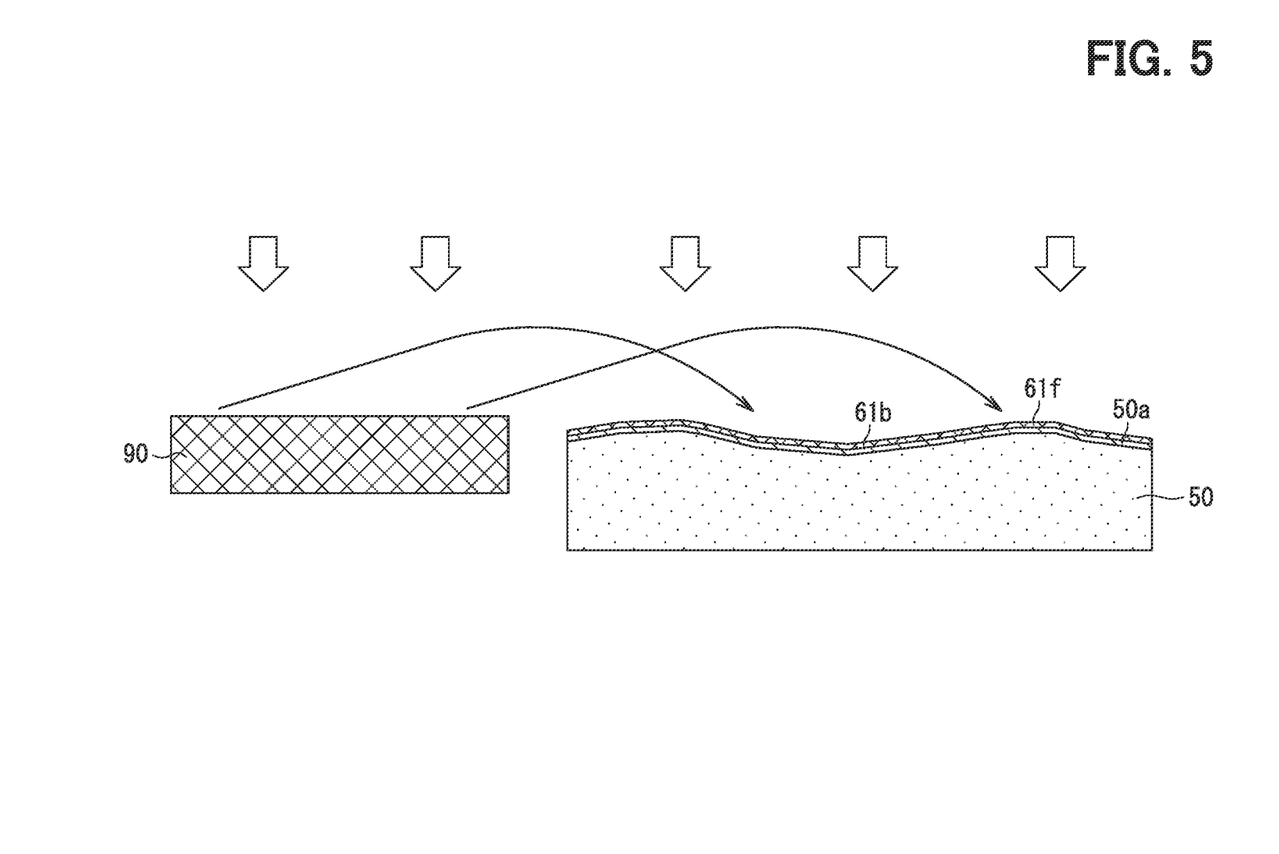
FIG. 5 is a cross-sectional view of a method of manufacturing the bonded structure.
Figure 6:
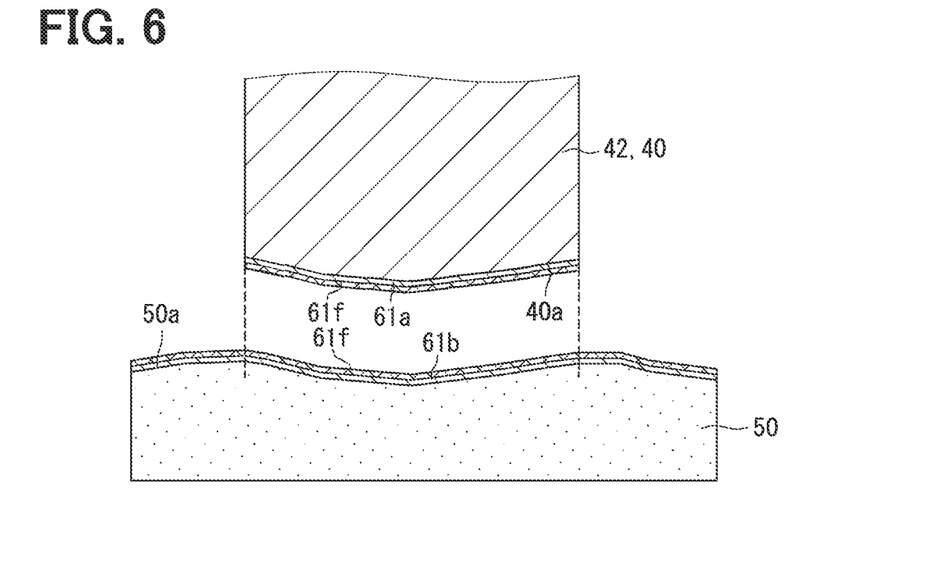
FIG. 6 is a cross-sectional view of a method of manufacturing the bonded structure.

Next, an example of a method for manufacturing the bonded structure 80 will be described with reference to FIGS. 2 to 6. FIGS. 3 to 6 are cross-sectional views corresponding to FIG. 2. In FIG. 5, an atmospheric pressure plasma processing is illustrated in a simplified manner. Further, for convenience, only the processing of the heat conductive member 50 is shown in the figure. In FIGS. 3, 4, and 6, in order to make the relationship with FIG. 2 easy to understand, the metal block 42 of the heat generator 40 and the heat conductive member 50 are shown in a facing formation to each other. However, each of the processing may be performed in a state/formation where the metal block 42 and the heat conductive member 50 do not face each other. Before joining/bonding, the metal block 42 and the heat conductive member 50 may be treated individually or may be treated in one process.

First, a mirroring process is performed. As shown in FIG. 3, the facing surface 40a of the metal block 42 (i.e., the heat generator 40) and the facing surface 50a of the heat conductive member 50 are respectively mirror-finished so as to have a predetermined flatness in the bonding region. The predetermined flatness is on the order of μm, for example, 1 to 3 μm. Specifically, the facing surface 40a and the facing surface 50a are mirrored by a process such as polishing, grinding, or lapping such as CMP (Chemical Mechanical Polishing).

Next, a process of forming a metal film for forming the metal bonding layer 60 is performed. In the present embodiment, in order to join the metal block 42 and the heat conductive member 50 by normal temperature joining at atmospheric pressure, metal films are formed on both surfaces of the facing surface 40a and the facing surface 50a. Specifically, as shown in FIG. 4, the first metal film 61a is formed on the facing surface 40a of the metal block 42 by, for example, a sputtering method. In the present embodiment, the first metal film 61a is formed on the entire surface of the facing surface 40a. Similarly, the first metal film 61b is formed on the facing surface 50a of the heat conductive member 50 by, for example, a sputtering method. In the present embodiment, the first metal film 61b is formed on the entire surface of the facing surface 50a.

In the bonding region, the first metal films 61a and 61b are formed so that the thickness t1 of the metal bonding layer 60 is less than the flatnesses F1 and F2. In the present embodiment, the first metal films 61a and 61b are formed so that the respective thicknesses in the bonding region are on the order of nm, for example, a dozen nm.

Next, between two processes of forming a metal film and bonding, a process for removing adsorbed matter on the surface of the first metal film and a process for forming a fluorine-containing film on the surface of the first metal film from which the adsorbed matter has been removed are performed.

In the present embodiment, an adsorbed matter removal process and a film formation process of the fluorine-containing film are performed in one process. As shown in FIG. 5, the heat conductive member 50 on which the first metal film 61b is formed and a fluorine-containing member 90 are subjected to the atmospheric pressure plasma process. As the carrier gas, an inert gas such as Ar is used. In such manner, the fluorine-containing member 90 may be a member at least containing a fluorine element. For example, a sheet member of polytetrafluoroethylene can be used.

By the plasma process, adsorbed matter on the surface of the first metal film 61b, such as water and oxygen contained in the air, are removed. In addition, the fluorine element is repelled from the fluorine-containing member 90. The repelled fluorine element is deposited on the surface of the first metal film 61b from which adsorbed matter has been removed to form the fluorine-containing film 61f. The fluorine-containing film 61f is a film containing at least a fluorine element. The thickness of the fluorine-containing film 61f is on the order of nm, and is equal to or less than the thickness of each of the first metal films 61a and 61b. In such manner, the plasma process removes the adsorbed matter on the surface of the first metal film 61b and forms the fluorine-containing film 61f on the first metal film 61b. After removing the adsorbed matter, a fluorine-containing film 61f is formed before re-adsorption occurs.

Although not shown, the metal block 42 on which the first metal film 61a is formed and the fluorine-containing member 90 are similarly subjected to the atmospheric pressure plasma process. The plasma process removes the adsorbed matter on the surface of the first metal film 61a. Further, the fluorine element repelled from the fluorine-containing member 90 is deposited on the surface of the first metal film 61a from which the adsorbed matter has been removed to form the fluorine-containing film 61f. In such manner, the plasma process removes the adsorbed matter on the surface of the first metal film 61a, and forms a fluorine-containing film 61f on the first metal film 61a. After removing the adsorbed matter, a fluorine-containing film 61f is formed before re-adsorption occurs.

As a result, as shown in FIG. 6, the fluorine-containing film 61f is formed on the surfaces of the first metal films 61a and 61b, respectively. That is, the surfaces of the first metal films 61a and 61b are coated with fluorine.

In the present embodiment, an example of performing the plasma process in atmospheric pressure is shown, but the present disclosure is not limited to such method. Plasma process may be performed under vacuum (i.e., in a decompression state). Further, instead of performing the plasma process, an ion beam process may be performed.

Next, a process for forming the metal bonding layer 60 is performed. That is, a process of joining/bonding the metal block 42 and the heat conductive member 50 at room temperature is performed. In the present embodiment, the metal bonding layer 60 is formed in the atmosphere. As shown in FIG. 6, the metal block 42 and the heat conductive member 50 are respectively positioned so that the bonding regions of the facing surface 40a of the metal block 42 (i.e., the heat generator 40) and the facing surface 50a of the heat conductive member 50 face each other. Then, although not shown in the drawing, the metal block 42 and the heat conductive member 50 are displaced relatively, i.e., toward each other, in a direction in which the facing surfaces 40a and 50a come close to each other, and the fluorine-containing films 61f are brought into contact with each other.

In such state, when pressure is applied in an alignment/arrangement direction of the metal block 42 and the heat conductive member 50, the fluorine element in the fluorine-containing film 61f diffuses into at least the inside of the first metal films 61a and 61b. Further, the first metal films 61a and 61b come into contact with each other and the gold diffuses with each other to form the first bonding layer (i.e., the first bonding layers 60a and 60b). In such manner, the metal bonding layer 60 including the first bonding layers 60a and 60b is formed. In the present embodiment, almost the entire surface of the facing region is joined/bonded at the atomic level.

As described above, when the metal bonding layer 60 is formed by room temperature bonding, the fluorine element is diffused and dispersed at least inside the first bonding layers 60a and 60b. Therefore, in the metal bonding layer 60 formed in the above-described manner, fluorine elements are dispersed at least inside the first bonding layers 60a and 60b. Of the first metal films 61a and 61b, the portion that does not contribute to the formation of the metal bonding layer 60 remains as a metal film. In the present embodiment, of the first metal film 61b formed on the facing surface 50a of the heat conductive member 50, most of the non-facing region not facing the facing surface 40a remains as the first metal film 61b. The fluorine-containing film 61f disappears in the bonding region and remains in most of the non-facing region.

The heat generating component 41 constituting the heat generator 40 and the metal block 42 are joined, for example, after the metal block 42 and the heat conductive member 50 are joined. The metal block 42 to which the heat conductive member 50 is joined is connected to the land 33 of the substrate 30. Then, the heat generating component 41 may be connected to the metal block 42 while being mounted on the substrate 30. By joining the heat generating component 41 and the metal block 42, a heat generator 40 and thus a bonded structure 80 are formed.

<Summary of the First Embodiment>

In the electronic device 10 of the present embodiment, instead of using the heat conducting member having fluidity such as heat-dissipating gel, the heat conductive member 50 having flexibility and capable of joining/bonding at room temperature is used. The heat conductive member 50 is joined to the metal block 42 constituting the heat generator 40 via the metal bonding layer 60. The metal bonding layer 60 includes the first bonding layers 60a and 60b, which are gold bonding layers. The thickness of the metal bonding layer 60 is less than the flatness of each of (i) the facing surface 40a, which is the first surface of the heat generator 40, and (ii) the facing surface 50a, which is the second surface of the heat conductive member 50. That is, the heat generator 40 and the heat conductive member 50 are joined at room temperature, and the metal bonding layer 60 is thin.

As a result, the thermal resistance at the interface between the heat generator 40 and the heat conductive member 50 is reducible in the heat radiation path from the heat generator 40 to the case 21 which is a heat dissipation member. As a result, it is possible to provide the electronic device 10 having improved heat dissipation capability. The heat conductive member 50 is in contact with the case 21, which is a heat dissipation member, without being joined thereto (i.e., to the case 21). Therefore, the heat conductive member 50 can follow the unevenness and absorb the height variation between the heat generator 40 and the case 21.

In the present embodiment, the heat conductive member 50 is implemented by using any one of a graphite sheet, a carbon nanotube sheet, a graphite mixed resin, and a filler mixed resin as described above. The heat conductive member 50 configured in such manner can be joined to the heat generator 40 at room temperature while having flexibility and good/high heat conductivity.

Stresses such as thermal stress and external vibration act on the bonded structure of the heat generating component and the heat conductive member. For example, if the thermal expansion coefficients of the two members forming the bonded structure are different, thermal stress (i.e., a first thermal stress) is generated due to expansion and contraction factors inside the bonded structure. Further, when an electronic device includes a bonded structure, thermal stress (i.e., a second thermal stress) is generated due to expansion and contraction factors of the entire electronic device, which are caused by an assembly of the device using a plurality of different materials. The second thermal stress may also act on the bonded structure of similar materials. Further, not only thermal stress but also stress such as external mechanism mechanically connected to the bonded structure and vibration transmitted from an external device also acts on the bonded structure. When two members are connected using a joining member such as solder, stress is concentrated on the joining member because the joining member/portion is thick (i.e., thicker than other portions).

In the present embodiment, as described above, the thickness t1 of the metal bonding layer 60 constituting the bonded structure 80 is less than the flatness F1 in the bonding region of the facing surface 40a of the heat generator 40 and the facing surface of the heat conductive member 50, and is also less than the flatness F2 in the bonding region of the facing surface 50a of the heat conductive member 50. Since the metal bonding layer 60 is thin, stress can be handled, i.e., cooperatively borne, by the metal block 42 and the heat conductive member 50 in the vicinity of the metal bonding layer 60. Therefore, it is possible to prevent the stress from concentrating on the metal bonding layer 60. Thereby, both of high bonding strength and high fatigue endurance strength are achievable.

Further, in the present embodiment, the fluorine element is dispersed inside the first bonding layers 60a and 60b (i.e., in the gold bonding layer), that is, in the entire metal bonding layer 60. Therefore, the water-repellent effect of the fluorine element prevents the invasion of water into the bonded structure. Even when minute cracks are generated at an end portion of the metal bonding layer 60 due to stress concentration, crack growth due to the intrusion of moisture from the air is suppressible. Thereby, high fatigue endurance strength is achievable. Thus, the bonded structure 80 achieves high connection reliability.

In the present embodiment, after the first metal films 61a and 61b are formed and before the metal bonding layer 60 is formed, the adsorbed matters on the surfaces of the first metal films 61a and 61b are removed, and the adsorbed matters are removed, and the fluorine-containing film 61f is formed on the adsorbed-matter-removed surfaces of the first metal films 61a and 61b. By removing the adsorbed matter, faulty bonding is suppressible/prevented. Further, since the fluorine-containing film 61f prevents the re-adsorption of the adsorbed matter on the surfaces of the first metal films 61a and 61b, the bonding in the atmosphere is stabilized.

Further, in the process of forming the metal bonding layer 60 by normal temperature bonding, the fluorine element derived from the fluorine-containing film 61f diffuses into at least the first bonding layers 60a and 60b of the metal bonding layer 60 (i.e., into the gold bonding layer). Therefore, even if minute cracks are generated at an end portion of the metal bonding layer 60 due to stress concentration, the invasion of water is suppressible by the fluorine element. Therefore, based on the above-described features, the bonded structure 80 can provide high connection reliability. Further, since the bonding is performed at room temperature, the residual stress at the time of bonding can be minimized.

In the present embodiment, adsorbed matters on the surfaces of the first metal films 61a and 61b are removed by the atmospheric pressure plasma process. Compared with vacuum processing (i.e., decompression), the manufacturing process can be simplified.

In the present embodiment, the heat conductive member 50 on which the first metal film 61b is formed and the fluorine-containing member 90 are subjected to the atmospheric pressure plasma process. By performing such a process, the removal of the adsorbed matter from the surfaces of the first metal films 61a and 61b and the formation of the fluorine-containing film 61f on the first metal films 61a and 61b are performable in one, common step. Therefore, the manufacturing process is simplified. Further, the fluorine-containing film 61f can be formed immediately after the adsorbed matter is removed. As a result, re-adsorption after removal of the adsorbed matter is more reliably preventable.

An example is shown in which the removal (cleaning) of the adsorbed matter on the surfaces of the first metal films 61a and 61b and the film formation of the fluorine-containing film 61f are performed in one, common process, but the present disclosure is not limited thereto. The adsorbed matter may be removed and the fluorine-containing film 61f may be formed separately. For example, after forming the first metal films 61a and 61b first, the adsorbed matters on the surfaces of the first metal films 61a and 61b are removed by a plasma process or an ion beam process at atmospheric pressure or vacuum. Then, after the adsorbed matter removal process is complete, the fluorine-containing film 61f is formed as soon as possible (e.g., immediately thereafter). For example, the fluorine-containing film 61f may be formed by a fluorine plasma process. Further, the fluorine-containing film 61f may be formed by exposing the device in the chamber to a fluoride gas such as CHF3 or CF6. Further, the fluorine-containing film 61f may be formed by subjecting the fluorine-containing member 90 to a plasma process.

Figure 7:
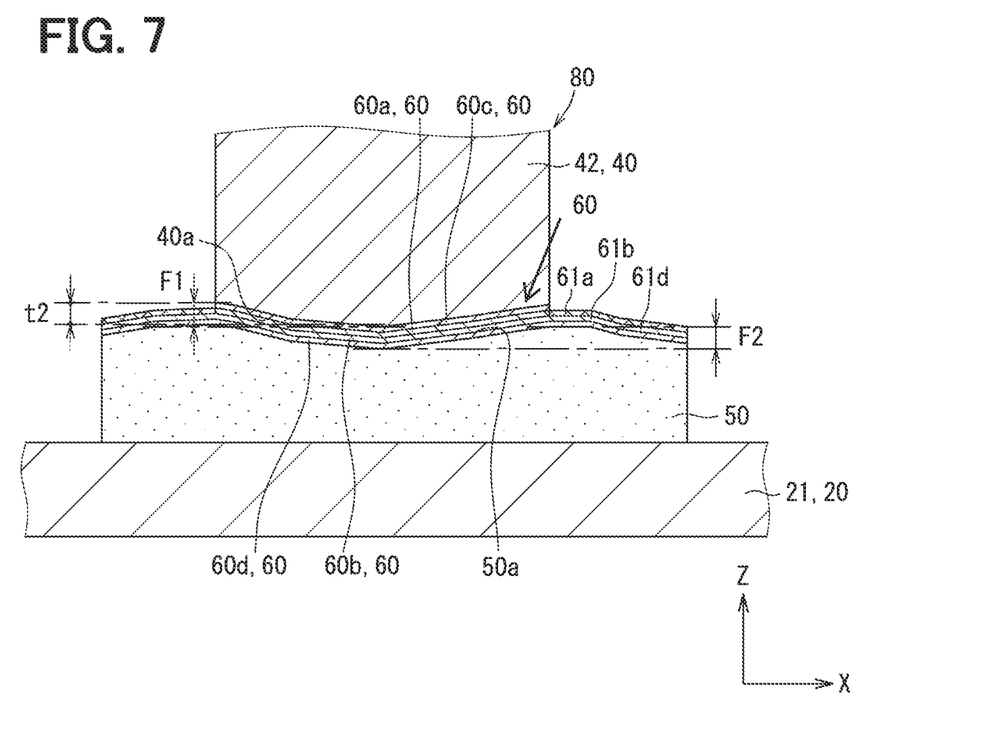
FIG. 7 is a cross-sectional view of a proximity of the bonded structure in the electronic device according to a second embodiment.

Second Embodiment, FIG. 7

The present embodiment is a modification of a preceding embodiment, which serves as a basic configuration, and may incorporate description of the precedent embodiment. In the preceding embodiment, the metal bonding layer 60 included only the first bonding layers 60a and 60b, which are gold bonding layers. Alternatively, the metal bonding layer 60 may include a second bonding layer interposed between (i) the heat generating component and/or the heat conductive member and (ii) the first bonding layer.

FIG. 7 shows a proximity of the bonded structure 80 in the electronic device 10 according to the present embodiment. FIG. 7 corresponds to FIG. 2. As shown in FIG. 7, a second bonding layer 60c is interposed between the metal block 42 constituting the heat generator 40 and the first bonding layer 60a. Further, a second bonding layer 60d is interposed between the heat conductive member 50 and the first bonding layer 60b.

The second bonding layers 60c and 60d are formed by using a material having a thermal expansion coefficient smaller than that of the materials constituting the first bonding layers 60a and 60b. The second bonding layers 60c and 60d are formed by using a constituting material, i.e., at least one of tantalum, tungsten, titanium, and chromium. These metals have a smaller thermal expansion coefficient than gold or gold alloys. The second bonding layers 60c and 60d are provided in the metal bonding layer 60, for example, to relieve stress.

Each of the second bonding layers 60c and 60d may have (i) a single-layer structure containing any of tantalum, tungsten, titanium, and chromium, or may have (ii) a multi-layer structure. The second bonding layer 60c is a bonding layer derived from a second metal film (not shown) formed on the facing surface 40a of the heat generator 40. The second bonding layer 60d is a bonding layer derived from a second metal film 61d formed on the facing surface 50a of the heat conductive member 50. Each of the second metal films is a metal film formed by using a constituting material of at least one of tantalum, tungsten, titanium, and chromium.

As shown in FIG. 7, the bonded structure 80 has the second metal film 61d on a non-facing region of the facing surface 50a of the heat conductive member 50. The second metal film 61d surrounds the second bonding layer 60d and, thus surrounds the metal bonding layer 60 in a plan view. The second metal film 61d in the non-facing region is a portion of the second metal films 61c and 61d that does not contribute to bonding and remains as a film. The second metal films 61c and 61d are formed (a) after the above-mentioned mirroring process and (b) before the first metal films 61a and 61b are formed. The second metal films 61c and 61d are formed by a sputtering method just like the first metal films 61a and 61b. In such manner, the thicknesses of the second bonding layers 60c and 60d are on the order of nm, e.g., a dozen nm.

A thickness t2 of the metal bonding layer 60 including the first bonding layers 60a and 60b and the second bonding layers 60c and 60d is less than the flatness F1 of the facing surface 40a of the heat generator 40 in the bonding region, and is less than the flatness F2 of the facing surface 50a of the heat conductive member 50 in the bonding region. The thickness t2 is on the order of nm, e.g., several tens of nm. The configuration other than the metal bonding layer 60 is the same as the configuration described in the preceding embodiment. The metal block 42 and the heat conductive member 50 are joined at room temperature. The heat conductive member 50 is not joined to the case 21, but is in contact with the case 21.

<Summary of the Second Embodiment>

In the present embodiment, the metal bonding layer 60 includes (i) the second bonding layer 60c arranged between the first bonding layer 60a and the heat generator 40, and (ii) the second bonding layer 60d arranged between the first bonding layer 60b and the heat conductive member 50. In the metal bonding layer 60 having such a multi-layer structure, the thickness t2 is less than the flatness F1 of the facing surface 40a and the flatness F2 of the facing surface 50a. That is, the heat generator 40 and the heat conductive member 50 are joined at room temperature, and the metal bonding layer 60 is thin. Therefore, as in the preceding embodiment, the thermal resistance at the interface between the heat generator 40 and the heat conductive member 50 is reducible, and thus the heat dissipation capability can be improved.

Further, since the metal bonding layer 60 is thin, stress can be handled/mitigatable by the heat generator 40 and the heat conductive member 50 in the vicinity of the metal bonding layer 60 as in the preceding embodiment. In addition, since the thermal expansion coefficients of the second bonding layers 60c and 60d are small, the concentration of thermal stress on the ends of the metal bonding layer 60 is reducible. Based on the above, high bonding strength and high fatigue endurance strength can be further achievable.

In particular, in the present embodiment, the second bonding layers 60c, 60d contain, as a constituting material, at least one of tantalum, tungsten, titanium, and chromium as component materials. These materials enhance adhesion between the heat generator 40 and the heat conductive member 50, reduce the concentration of thermal stress on the first bonding layers 60a and 60b, and contribute to the improvement of the initial strength and fatigue endurance strength. For example, when tantalum is used as a constituting material for the second bonding layers 60c and 60d, the fluorine element is also diffused into the second bonding layers 60c and 60d. Therefore, the invasion of water can more effectively be prevented by the water-repellent effect of the fluorine element dispersed inside the second bonding layers 60c and 60d.

Figure 8:
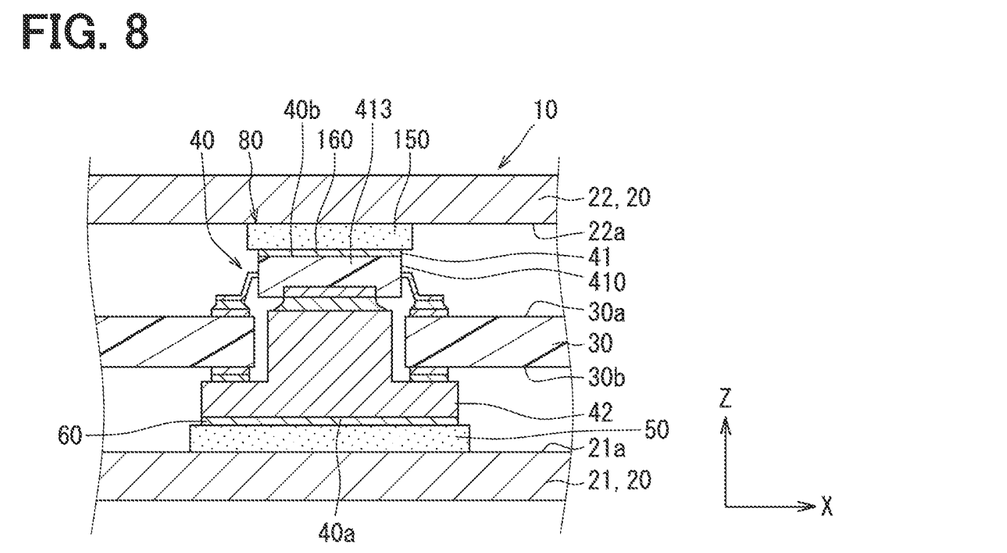
FIG. 8 is a cross-sectional view of the electronic device according to a third embodiment.
Figure 9:
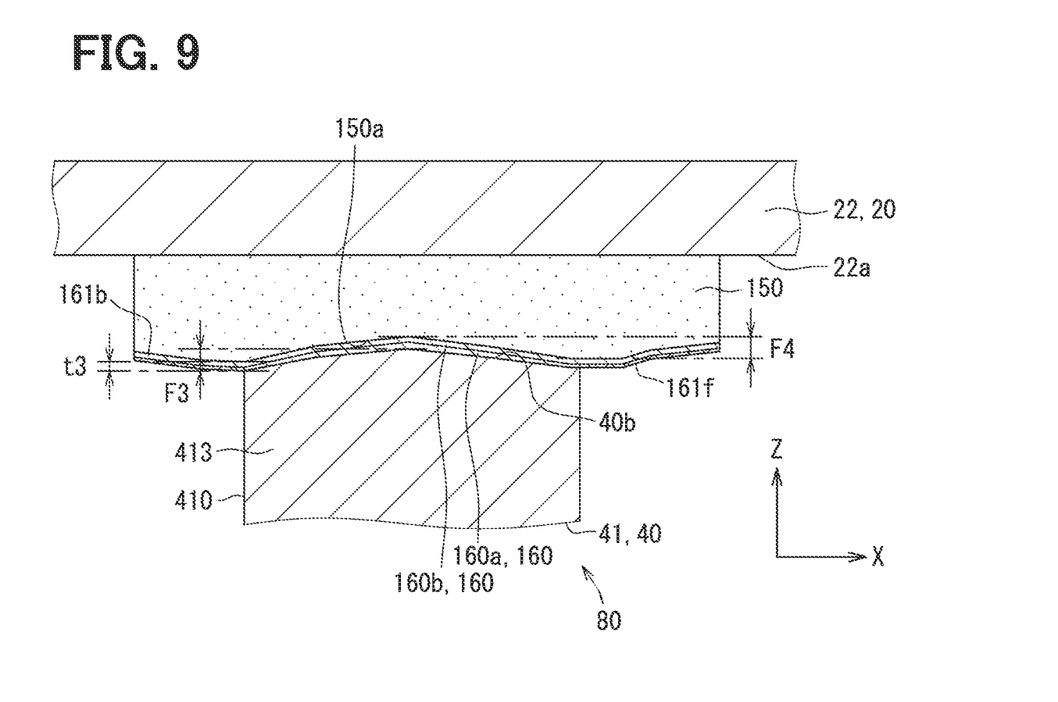
FIG. 9 is a cross-sectional view of a proximity of the bonded structure in the electronic device.

Third Embodiment, FIGS. 8 and 9

The present embodiment is a modification of a preceding embodiment, which serves as a basic configuration, and may incorporate description of the precedent embodiment. In the preceding embodiment, an example of a structure in which the heat generator 40 dissipates heat to the case 21 via the heat conductive member 50 is shown. That is, an example of a single-sided heat dissipation structure is shown. Instead of the above, the above-mentioned bonding structure may be applied to the double-sided heat dissipation structure. FIG. 8 shows the electronic device 10 of the present embodiment. FIG. 8 corresponds to FIG. 1. As shown in FIG. 8, the electronic device 10 further includes a heat conductive member 150 and a metal bonding layer 160 in addition to the configuration of the preceding embodiment (see FIG. 2). In the Z direction, the heat conductive member 150 is interposed between the heat generating component 41 constituting the heat generator 40 and the metal cover 22. The heat conductive member 150 is not joined to the cover 22, but is in contact with the cover 22. The heat conductive member 150 is joined to the heat generating component 41 via the metal bonding layer 160. The bonded structure 80 includes the heat generator 40, the heat conductive members 50 and 150, and the metal bonding layers 60 and 160. The heat conductive member 50 corresponds to a first heat conductive member, and the heat conductive member 150 corresponds to a second heat conductive member. The metal bonding layer 60 corresponds to a first metal bonding layer, and the metal bonding layer 160 corresponds to a second metal bonding layer.

FIG. 9 shows a part of the bonded structure 80. The bonding structure of bonding the heat generating component 41, the heat conductive member 150, and the metal bonding layer 160 is basically the same as the bonding structure of bonding the metal block 42, the heat conductive member 50, and the metal bonding layer 60 shown in the preceding embodiment. The main body 410 of the heat generating component 41 has the sealing resin body 413 as described above. The sealing resin body 413 is molded by using, for example, an epoxy resin. The upper surface of the sealing resin body 413 forms a facing surface 40b facing the heat conductive member 150 in the heat generator 40. The facing surfaces 40a and 40b correspond to a first surface.

The heat conductive member 150 has the same structure as the heat conductive member 50. Since the heat conductive member 150 is sandwiched/positioned between the cover 22 and the heat generator 40 in a fixed state, the heat conductive member 150 has flexibility to follow unevenness and absorb height variations. However, the heat conductive member 150 does not have fluidity like thermal gel, thermal grease, and adhesive. Further, the heat conductive member 150 has good/high heat conductivity to conduct the heat of the heat generator 40 to the cover 22 which is a heat dissipation member. Further, the heat conductive member 150 is configured so that it can be joined to the heat generator 40 at room temperature. Specifically, the heat conductive member 150 is made of any one of a graphite sheet, a carbon nanotube sheet, a graphite mixed resin, and a filler mixed resin.

The arrangement of the sealing resin body 413 and the heat conductive member 150, that is, the size relationship between the sealing resin body 413 and the heat conductive member 150 is not particularly limited in a plan view from the facing direction of the sealing resin body 413 of the heat generating component 41 and the heat conductive member 150, that is, in the Z direction. The sealing resin body 413 (i.e., the heat generator 40) and the heat conductive member 150 may have at least a region where they overlap each other in a plan view. In the present embodiment, a facing surface 150a of the heat conductive member 150 includes/encompasses the entire area of the facing surface 40b in a plan view. The entire area of the facing surface 40b of the heat generator 40 faces the facing surface 150a of the heat conductive member 150. A part of the facing surface 150a of the heat conductive member 150 faces the facing surface 40b of the heat generator 40, and the remaining part of the facing surface 150a is the not facing the heat generator 40. Although not shown, the facing surface 40b of the heat generator 40 may be arranged to include the entire area of the facing surface 150a of the heat conductive member 150 in a plan view, or the facing surfaces 40b and 150a may be arranged to substantially coincide with (i.e., match with) each other in a plan view.

The metal bonding layer 160 has the same structure as the metal bonding layer 60. The metal bonding layer 160 is interposed between the facing surface 40b of the heat generator 40 and the facing surface 150a of the heat conductive member 150, and joins the heat generator 40 (i.e., the heat generating component 41) and the heat conductive member 150. The metal bonding layer 160 is interposed at least a part of the facing region between the heat generator 40 and the heat conductive member 150. In the present embodiment, the metal bonding layer 160 is interposed almost in the entire area of the facing region between the heat generator 40 and the heat conductive member 150. The metal bonding layer 160 includes at least the first bonding layer. The first bonding layer is made of gold or a gold alloy as a constituting material. The first bonding layer joins the heat generator 40 and the heat conductive member 150 by using the metal bonding layer 160. The metal bonding layer 160 of the present embodiment includes the first bonding layers 160a and 160b.

The first bonding layer 160a is mainly a bonding layer derived from the first metal film 161a (not shown) formed on the facing surface 40b of the heat generator 40 (i.e., the sealing resin body 413). The first bonding layer 160b is mainly a bonding layer derived from the first metal film 161b formed on the facing surface 150a of the heat conductive member 150. Each of the first metal films 161a and 161b is a gold-containing film. The gold in the first metal film 161a and the gold in the first metal film 161b are mutually diffused to form the first bonding layers 160a and 160b (i.e., atomic diffusion bonding). The first bonding layers 160a and 160b form one gold-containing bonding layer. As shown in FIG. 8, the bonded structure 80 has the first metal film 161b on a non-facing region of the facing surface 150a of the heat conductive member 150. The first metal film 161b surrounds the first bonding layer 160b and, thus (i.e., ultimately) surrounds the metal bonding layer 160 in a plan view. The first metal film 161b in the non-facing region is a portion of the first metal films 161a and 161b that does not contribute to diffusion bonding and remains as a film.

Each of the first metal films 161a and 161b is formed by a sputtering method. As a result, the thicknesses of the first bonding layers 160a and 160b are on the order of nm, e.g., a dozen nm. A thickness t3 of the metal bonding layer 160 is less than a flatness F3 of the facing surface 40b of the heat generator 40 in the bonding region, and is less than a flatness F4 of the facing surface 150a of the heat conductive member 150 in the bonding region. The thickness t3 is on the order of nm, e.g., several tens of nm. The flatnesses F3 and F4 are on the order of μm, e.g., 1 to 3 μm. The bonding region is a region in which the metal bonding layer 160 is formed in the facing region.

Just like the metal bonding layer 60, the metal bonding layer 160 described above contains at least the fluorine element in the first bonding layers 160a and 160b. The fluorine element is dispersed inside the first bonding layers 160a and 160b, that is, inside the gold-containing bonding layer. In the present embodiment, the fluorine element is dispersed throughout the metal bonding layer 60. The bonded structure 80 further includes a fluorine-containing film 161f. The fluorine-containing film 161f may be a film containing a fluorine element (i.e., a fluorine atom). As will be described later, the fluorine dispersed inside the first bonding layers 160a and 160b is derived from the fluorine-containing film 161f formed on the first metal films 161a and 161b. The fluorine-containing film 161f in the non-facing region included in the bonded structure 80 is a portion that remains as a film without diffusing into the metal bonding layer 160. The fluorine-containing film 161f surrounds the metal bonding layer 160 in a plan view.

Other configurations are the same as those described in the first embodiment. In the present embodiment, each of the facing surfaces 40a and 40b corresponds to a first surface. In the present embodiment, each of the facing surfaces 50a and 150a corresponds to a second surface. Each of the case 21 and the cover 22 corresponds to a heat dissipation member.

The method of joining the heat generator 40 (i.e., the heat generating component 41) and the heat conductive member 150 is the same as the method of joining the heat generator 40 (i.e., the metal block 42) and the heat conductive member 50 described in the preceding embodiment. Therefore, the description thereof is omitted.

<Summary of the Third Embodiment>

In the electronic device 10 of the present embodiment, instead of using the heat conducting member having fluidity such as heat-dissipating gel, the heat conducting member 150 having flexibility and capable of joining at room temperature is used. The heat conductive member 150 is joined to the heat generating component 41 constituting the heat generator 40 via the metal bonding layer 160. The metal bonding layer 160 includes the first bonding layers 160*a* and 160*b*, which are gold bonding layers. The thickness of the metal bonding layer 160 is less than the flatness of each of the facing surface 40*b*, which is the first surface of the heat generator 40, and the facing surface 150*a*, which is the second surface of the heat conductive member 150. That is, the heat generator 40 and the heat conductive member 150 are joined at room temperature, and the metal bonding layer 160 is thin. As a result, the thermal resistance at the interface between the heat generator 40 and the heat conductive member 150 is reducible in the heat dissipation path from the heat generator 40 to the cover 22 which is a heat dissipation member. In the present embodiment, as in the preceding embodiment, the heat generator 40 and the heat conductive member 50 are joined at room temperature, and the metal bonding layer 60 is thin, so that the thermal resistance at the interface between the heat generator 40 and the heat conductive member 50 is reduced. In such manner, the thermal resistance is reducible in each of (i) the heat dissipation path from the heat generator 40 to the case 21 and (ii) the heat dissipation path from the heat generator 40 to the cover 22. Therefore, in the electronic device 10 having a double-sided heat dissipation structure, the heat dissipation capability can further be improved.

Further, the heat conductive member 150 is also in contact with the cover 22, which is a heat dissipation member, without being joined to the cover 22, just like the heat conductive member 50. Therefore, the heat conductive member 150 can follow the unevenness and absorb the height variation between the heat generator 40 and the cover 22. Further, since the metal bonding layer 160 is thin, stress can be handled by the heat generator 40 and the heat conductive member 150 in the vicinity of the metal bonding layer 160. Therefore, it is possible to prevent the stress from concentrating on the metal bonding layer 160. Thereby, both of high bonding strength and high fatigue endurance strength are achievable.

Further, as in the first bonding layers 60*a* and 60*b*, the fluorine element is dispersed inside the first bonding layers 160*a* and 160*b*, that is, throughout the entire metal bonding layer 160. Therefore, the water-repellent effect of the fluorine element prevents the invasion of water into the bonded structure. Even if minute cracks are generated at the end/edge of the metal bonding layer 160 due to stress concentration, crack growth due to the intrusion of moisture from the air can be suppressed. Thereby, high fatigue endurance strength is achievable.

The double-sided heat dissipation structure described in the present embodiment may be combined with the configuration described in the second embodiment. For example, one of the metal bonding layers 60 and 160 may be configured to include a second bonding layer. The metal bonding layers 60 and 160 may both include the second bonding layer.

Figure 10:
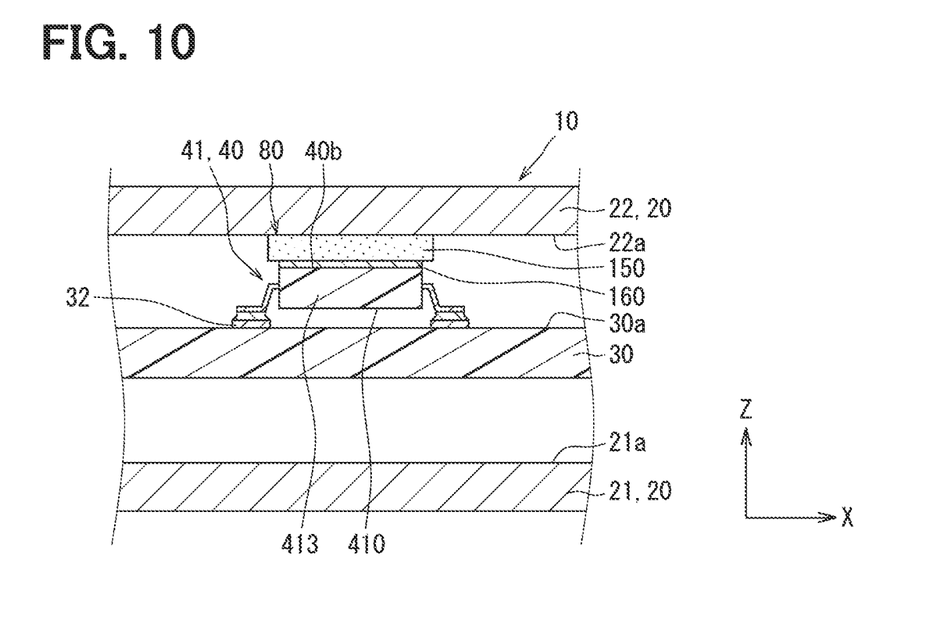
FIG. 10 is a cross-sectional view of the electronic device according to a fourth embodiment.

Fourth Embodiment, FIG. 10

The present embodiment is a modification of a preceding embodiment, which serves as a basic configuration, and may incorporate description of the precedent embodiment. In the above-described embodiment, an example of a single-sided heat dissipation structure in which the heat generator 40 dissipates heat to the case 21 via the heat conductive member 50 is shown. Further, in another embodiment, an example of a double-sided heat dissipation structure is shown. Instead of those configurations described above, the above-mentioned bonded structure may be applied to the single-sided heat dissipation structure that dissipates heat from the heat generating component to the cover.

FIG. 10 shows the electronic device 10 of the present embodiment. FIG. 10 corresponds to FIG. 1. Similar to the third embodiment (see FIG. 8), the heat conductive member 150 is interposed between the cover 22 and the heat generator 40 (i.e., the heat generating component 41). The heat conductive member 150 is in contact with the cover 22. The heat conductive member 150 is joined to the sealing resin body 413 of the heat generating component 41 via the metal bonding layer 160. That is, the heat generator 40 and the heat conductive member 150 are joined at room temperature. The electronic device 10 has a heat dissipation path from the heat generator 40 to the cover 22. On the other hand, the heat generator 40 of the present embodiment does not include the metal block 42 shown in the preceding embodiment. The heat generator 40 includes only the heat generating component 41. The substrate 30 does not have the through hole 31 and the land 33. The electronic device 10 does not have a heat dissipation path from the heat generator 40 to the case 21. The electronic device 10 has a single-sided heat dissipation structure. Other configurations are the same as those described in the third embodiment.

<Summary of the Fourth Embodiment>

According to the electronic device 10 of the present embodiment, the heat generator 40 and the heat conductive member 150 are joined at room temperature, and the metal bonding layer 160 is thin, as in the electronic device 10 shown in the third embodiment. As a result, the thermal resistance at the interface between the heat generator 40 and the heat conductive member 150 is reducible in the heat dissipation path from the heat generator 40 to the cover 22 which is a heat dissipation member. Therefore, in the electronic device 10 having a single-sided heat dissipation structure that dissipates heat to the cover 22, heat dissipation capability is improvable.

Further, since the heat conductive member 150 is in contact with the cover 22 which is a heat dissipation member, it is possible to follow the unevenness and absorb the height variation between the heat generator 40 and the cover 22. Further, since the metal bonding layer 160 is thin, it is possible to suppress the stress from being concentrated on the metal bonding layer 160.

Similar to the third embodiment, when the fluorine element is dispersed inside the first bonding layers 160*a* and 160*b*, that is, in the entire metal bonding layer 160, the water repellent effect of the fluorine element can prevent the intrusion of water (into the metal bonding layer 160. Even if minute cracks are generated at the end/edge of the metal bonding layer 160 due to stress concentration, crack growth due to the intrusion of moisture from the air can be suppressed. Thereby, high fatigue endurance strength is achievable.

The heat generator 40 having a configuration that does not include the metal block 42 is shown so far. However, the present disclosure is not limited thereto. In a configuration in which the heat generator 40 includes the metal block 42, the heat dissipation path may be formed only between the heat generating component 41 and the cover 22. That is, the heat conductive member 150 may be interposed between the heat generating component 41 and the cover 22, and the heat conductive member 50 may be not interposed between the metal block 42 and the case 21. In the present embodiment, since heat is not dissipated to the case 21, the case 21 may be made of resin.

The single-sided heat dissipation structure described in the present embodiment may be combined with the configuration described in the second embodiment. That is, the metal bonding layer 160 may be configured to include the second bonding layer.

Other Embodiments

The present disclosure in the specification and drawings is not limited to the above-exemplified embodiments. The present disclosure encompasses the illustrated embodiments and modifications based on the embodiments by those skilled in the art. For example, the present disclosure is not limited to the combinations of the components and/or element shown in the embodiments. The present disclosure may be implemented in various combinations. The present disclosure may have additional portions that may be added to the embodiments. The present disclosure encompasses omission of components and/or elements of the embodiments. The present disclosure encompasses the replacement or combination of components and/or elements between one embodiment and the other. The disclosed technical scope is not limited to the description of the embodiments. It should be understood that some disclosed technical ranges are indicated by description of claims, and includes every modification within the equivalent meaning and the scope of description of claims.

The disclosure in the specification, drawings and the like is not limited by the description of the claims. The disclosure in the specification, the drawings, and the like encompasses the technical ideas described in the claims, and further extends to a wider variety of technical ideas than those in the claims. Therefore, various technical ideas can be extracted from the disclosure of the specification, the drawings and the like without being limited to the description of the claims.

The spatial relative terms "below/lower" and "above/upper" are used herein to facilitate the description of one element or feature's relationship to another element or feature, as illustrated in the drawings. Spatial relative terms can be intended to include different orientations of a device in use or operation, in addition to the orientations depicted in the drawings. For example, when the device in the drawing is flipped over, an element described as "below" other element or feature is positioned "above" of the other element or feature. Therefore, the term "below" can include both above and below. The device may also be oriented in the other direction (e.g., rotated 90 degrees or in any other angle/direction) and the spatial relative terms used herein are interpreted accordingly.

An example of joining the heat generator 40 and the heat conductive member 50 at room temperature in the atmosphere has been shown, but the present disclosure is not limited to such configuration. Joining components at room temperature under vacuum (under reduced pressure) may also be performed. In case of joining/bonding under vacuum, both the first metal films 61a and 61b may be provided, or only one of the first metal films 61a and 61b may be provided. For example, the first metal film 61a may be not provided on the facing surface 40a, but the first metal film 61b may be provided on the facing surface 50a and joined at room temperature under vacuum. In such case, the metal bonding layer 60 includes the first bonding layer 60b. That is, the metal bonding layer 60 may have only one of the first bonding layers 60a and 60b (i.e., gold bonding layer). The same applies to the metal bonding layer 160 that joins the heat generator 40 and the heat conductive member 150.

In the second embodiment, an example in which (a) the second metal film 61c is provided between the heat generator 40 and the first metal film 61a and (b) the second metal film 61d is provided between the heat conductive member 50 and the first metal film 61b is shown. However, the present disclosure is not limited thereto. Only one of the second metal films 61c and 61d may be provided. For example, in a configuration in which only the first metal film 61b is formed, the second metal film 61d may be provided between the facing surface 50a of the heat conductive member 50 and the first metal film 61b, and the second metal film 61c may be not provided on the facing surface 40a that does not have the first metal film 61a. The same applies to the metal bonding layer 160.

Examples of the metal bonding layers 60 and 160 containing the fluorine element have been shown. However, the present disclosure is not limited thereto. The metal bonding layers 60 and 160 that do not contain the fluorine element can also be adopted.

An example has been shown in which the case 21 and/or the cover 22 constituting the housing 20 is used as a heat dissipation member. However, the present disclosure is not limited thereto. For example, a heat sink fixed to the case 21 may be used as a heat dissipation member. In such case, a part of the heat sink may project out of the case 21, for example, through an opening formed in the bottom of the case 21.

What is claimed is:
1. An electronic device comprising:
   a heat generator including at least an electronic component that generates heat when energized and having a first surface;
   a heat dissipation member dissipating heat of the heat generator;
   a heat conductive member having a second surface facing the first surface of the heat generator and conducting the heat of the heat generator to the heat dissipation member;
   a metal bonding layer interposed between (i) the first surface of the heat generator and (ii) the second surface of the heat conductive member to join the heat generator and the heat conductive member, the metal bonding layer at least including a gold bonding layer made of gold or a gold alloy, wherein
   a thickness of the metal bonding layer is configured to be less than each of a flatness of a bonding region with the metal bonding layer on the first surface and a flatness of a bonding region with the metal bonding layer on the second surface, and
   the heat conductive member has flexibility, is joined to the heat generator via the metal bonding layer, and is in contact with the heat dissipation member.

2. The electronic device of claim 1, wherein
the heat generator further includes a metal block connected to the electronic component.

3. The electronic device of claim 2, wherein
the metal bonding layer is interposed between (i) the first surface of the metal block opposite to a connection surface with the electronic component and (ii) the heat conductive member, and the metal bonding layer joins the metal block and the heat conductive member.

4. The electronic device of claim 3, wherein
the heat conductive member further includes an upper heat conductive member arranged to face an upper surface of the electronic component opposite to the connection surface of the metal block, and
the metal bonding layer includes a first metal bonding layer for bonding the metal block and the first heat conductive member, and a second metal bonding layer for bonding the electronic component and the second heat conductive member.

5. The electronic device of claim 1, wherein
the heat conductive member is joined to the electronic component via the metal bonding layer.

6. The electronic device of claim 1, wherein
the heat conductive member is made of any one of a graphite sheet, a carbon nanotube sheet, a graphite mixed resin, and a filler mixed resin.

7. The electronic device of claim 1, wherein
a fluorine element is dispersed in at least an inside of the gold bonding layer in the metal bonding layer.

8. The electronic device of claim 1, wherein
the metal bonding layer includes a second bonding layer located at least one of:
  (A) between (i) the heat generator and (ii) the first bonding layer which is the gold bonding layer, and
  (B) between (i) the heat conductive member and (ii) the first bonding layer, and
the second bonding layer has a thermal expansion coefficient less than that the first bonding layer.

9. The electronic device of claim 8, wherein
the second bonding layer contains at least one of tantalum, tungsten, titanium, and chromium.

10. The electronic device of claim 1, wherein
the heat dissipation member is a housing that houses the heat generator, the heat conductive member, and the metal bonding layer.

11. An electronic device comprising:
a case;
a heat conducting member located on the case;
a metal bonding layer located on the heat conducting member;
a metal block located on the metal bonding layer;
a main bonding material located on the metal block;
a heat generating component including:
  (i) a heat sink located on the main bonding material,
  (ii) a main body located substantially on the heat sink, and
  (iii) a terminal extending from a side of the main body;
a substrate;
a wiring land located on a top of the substrate;
a wiring bonding material joining the wiring land to the terminal;
a dummy land located on a bottom of the substrate; and
a dummy bonding material joining the dummy land to the metal block;
wherein:
the substrate includes a through hole located substantially beneath the heat generating component,
the metal block includes:
  (i) a diameter-reduced portion passing vertically through the through hole, and
  (ii) a diameter-expanded portion located below the substrate and extending horizontally such that a non-facing part of the diameter-expanded portion is NOT beneath the through hole, and
the dummy bonding material is located on the non-facing part of the diameter-expanded portion, such that:
  (i) the substrate is supported at least partly on the dummy land,
  (ii) the dummy land is supported on the dummy bonding material, and
  (iii) the dummy bonding material is supported on the non-facing part of the diameter-expanded portion of the metal block.

12. The electronic device of claim 11, wherein the metal bonding layer includes:
  (i) a first lower bonding layer located on a lower facing surface of the metal block; and
  (ii) a first upper bonding layer located on an upper facing surface of the heat conductive member.

13. The electronic device of claim 12, wherein:
the first lower bonding layer includes gold, and
the first upper bonding layer includes additional gold.

14. The electronic device of claim 13, wherein:
the first lower bonding layer and the first upper bonding layer form the metal bonding layer through room temperature bonding.

15. The electronic device of claim 14, wherein:
the metal bonding layer includes flourine.

16. The electronic device of claim 11, wherein the metal bonding layer includes at least four layers:
a first lower bonding layer including gold;
a second lower bonding layer located on a lower facing surface of the metal block;
a first upper bonding layer including additional gold; and
a second upper bonding layer located on an upper facing surface of the heat conductive member.

17. The electronic device of claim 16, wherein the at least four layers are layered in the following order, from the heat conductive member to the metal block:
  (i) the second upper bonding layer;
  (ii) the first upper bonding layer;
  (iii) the first lower bonding layer; and
  (iv) the second lower bonding layer.

18. The electronic device of claim 17, wherein:
the second upper bonding layer is configured to reduce thermal expansion damage between the first upper bonding layer and the heat conductive member, and
the second lower bonding layer is configured to reduce additional thermal expansion damage between the metal block and the first lower bonding layer.

19. The electronic device of claim 18, wherein:
the second lower bonding layer and the second upper bonding layer each contain at least one of the following metals:
  (i) tantalum,
  (ii) tungsten,
  (iii) titanium, and
  (iv) chromium.

20. The electronic device of claim 11, wherein:
the main body does NOT contact the substrate,
the heat generating component is flexibly attached to the substrate through the terminal, and the heat generating component is configured to rise relative to the substrate as the diameter-reduced portion of the metal block thermally expands upwardly.

\* \* \* \* \*